(12) United States Patent
Kanatzidis et al.

(10) Patent No.: US 7,592,535 B2
(45) Date of Patent: Sep. 22, 2009

(54) SILVER-CONTAINING THERMOELECTRIC COMPOUNDS

(75) Inventors: Mercouri Kanatzidis, Okemos, MI (US); Kuei-Fang Hsu, Chang Hua Hsien (TW)

(73) Assignee: Board of Trustees operating Michigan State University, East Lansing, MI (US)

( * ) Notice: Subject to any disclaimer, the term of this patent is extended or adjusted under 35 U.S.C. 154(b) by 118 days.

(21) Appl. No.: 10/571,338

(22) PCT Filed: Aug. 25, 2004

(86) PCT No.: PCT/US2004/027536

§ 371 (c)(1),
(2), (4) Date: Dec. 11, 2006

(87) PCT Pub. No.: WO2005/036660

PCT Pub. Date: Apr. 21, 2005

(65) Prior Publication Data

US 2007/0107764 A1    May 17, 2007

Related U.S. Application Data

(60) Provisional application No. 60/502,819, filed on Sep. 12, 2003.

(51) Int. Cl.
*H01L 37/00* (2006.01)
*H01L 35/30* (2006.01)

(52) U.S. Cl. .................. 136/241; 136/238; 136/239; 252/62.3 T

(58) Field of Classification Search .................. 136/241
See application file for complete search history.

(56) References Cited

U.S. PATENT DOCUMENTS 2,602,095 A    7/1952   Faus
(Continued)

FOREIGN PATENT DOCUMENTS

WO       WO-00/24040       4/2000

OTHER PUBLICATIONS

Database Inspec 'Online! The Institution of Electrical Engineers, Stevenage, GB, Feb. 6, 2004, Kuei Fang Hsu et al: "Cubic AgPbmSb Te2+m: bulk thermoelectric materials with high figure of merit"; XP002328054, Database accession No. 7875774.
(Continued)

*Primary Examiner*—Alexa D Neckel
*Assistant Examiner*—Miriam Berdichevsky
(74) *Attorney, Agent, or Firm*—Harness, Dickey & Pierce, P.L.C.

(57) ABSTRACT

A thermoelectric material of the general formula $Ag_{1-x} M_m M'Q_{2+m}$, wherein M is selected from the group consisting of Pb, Sn, Ca, Sr, Ba, divalent transition metals, and combinations thereof; M' is selected from the group consisting of Bi, Sb, and combinations thereof; Q is selected from the group consisting of Se, Te, S, and combinations thereof; $8 \leq m \leq 24$; and $0.01 \leq x \leq 0.7$. In embodiments of the invention, the compositions exhibit n-type semiconductor properties. In preferred embodiments, x is from 0.1 to 0.3, and m is from 10 to 18. The compositions may be synthesized by adding stoichiometric amounts of starting materials comprising Ag, M, M', and Q to a reaction vessel, heating the starting materials to a temperature and for a period of time sufficient to melt the materials, and cooling the reaction product at a controlled rate of cooling.

48 Claims, 3 Drawing Sheets

U.S. PATENT DOCUMENTS

| | | | |
|---|---|---|---|
| 2,728,637 | A | 12/1955 | Alderson et al. |
| 2,770,528 | A | 11/1956 | Maynard |
| 2,882,467 | A | 4/1959 | Wernick |
| 2,882,468 | A | 4/1959 | Wernick |
| 3,008,797 | A | 4/1961 | Bither |
| 2,995,613 | A | 8/1961 | Wernick |
| 3,211,655 | A | 10/1965 | Fleischmann |
| 3,211,656 | A | 10/1965 | Rupprecht |
| 3,238,134 | A | 3/1966 | Fleischmann |
| 3,318,669 | A | 5/1967 | Folberth |
| 3,945,855 | A | 3/1976 | Skrabek et al. |
| 5,187,052 | A | 2/1993 | Maeda et al. |
| 5,368,701 | A | 11/1994 | Warren et al. |
| 5,448,109 | A | 9/1995 | Cauchy |
| 5,606,213 | A | 2/1997 | Kherani et al. |
| 5,610,366 | A | 3/1997 | Fleurial et al. |
| 5,708,233 | A | 1/1998 | Ochi et al. |
| 5,719,390 | A | 2/1998 | Tateishi et al. |
| 5,726,381 | A | 3/1998 | Horio et al. |
| 5,773,829 | A | 6/1998 | Iwanczyk et al. |
| 5,936,193 | A | 8/1999 | Parise |
| 6,034,318 | A | 3/2000 | Lycke et al. |
| 6,103,967 | A | 8/2000 | Cauchy et al. |
| 6,129,673 | A | 10/2000 | Fraden |
| 6,312,617 | B1 | 11/2001 | Kanatzidis et al. |
| 6,313,393 | B1 | 11/2001 | Drost |
| 6,342,668 | B1 | 1/2002 | Fleurial et al. |
| 6,444,894 | B1 | 9/2002 | Sterzel |
| 2005/0076944 | A1 | 4/2005 | Kanatzidis et al. |

OTHER PUBLICATIONS

Science American Asoc. Adv. Sci USA, vol. 303, No. 5659, Feb. 6, 2004, pp. 818-821, XP002328052, ISSN: 0036-8075.

Database Inspec 'Online! The Institution of Electrical Engineers, Stevenage, GB; 2004, Kuei-Fang Hsu et al: "Thermoelectric properties of the cubic AgPb10SbTe12"; XP002328055, Database accession No. 7986290.

Thermoelectric Materials 2003—Research and Applications Symposium 1-3, Dec. 2003, Boston, MA, USA, vol. 793, 2004, pp. 155-160, SP002328053; Thermoelectric Materials 2003—Research and Applications Symposium (Mater. Res. Soc. Symposium Proceedings vol. 793) Mater. Res. Soc Warrendale, PA, USA; ISBN: 1-55899-731-8.

International Search Report for PCT/US2004/027536, dated May 12, 2005.

Borissova et al., "Thermoelectric properties of materials based on PbTe and GeTe", Chapter 15, pp. 171-177.

Brixner, "Note on Schirmerite", Pigments Department, Experimental Station, E. I. du Pont de Nemours & Co., Inc., Mineralogical Notes, The American Mineralogist, vol. 50, pp. 259-260, Jan.-Feb. 1965.

Busch et al., "Minerals as prototypes for new semiconductor compounds", Bldg. Tech. Hochschule, Zurich, Switzerland, Helv. Phys. Acta., 33, pp. 657-666, 1960.

Fleischmann, "Heat Conductivity, Thermopower and Electric Conductivity of Semiconductor Mixed Crystals of the $(A_{x/2}^I B_{1-x}^{IV} C_{x/2}^V) D^{IV}$ Form" Zeitschrift fur Naturforschung 16a, pp. 765-780, Jun. 1961.

Goryunova, et al., "Possibility of formation of solid solutions in some quaternary systems", Vestnik Leningrad. Univ., pp. 156-158, 1961.

Lawson et al., "Preparation and properties of HgTe and mixed crystals of HgTe-CdTe", Phys. and Chem. Solids, 9, pp. 325-329, 1959.

Losev, "Equilibrium state of a gas behind a shock wave in oxygen, nitrogen, and their mixtures with xenon", Vestnik Moskov. Univ. Fiz., Astron., No. 5, pp. 47-52, 1960.

Plust et al., "Electron-microscope investigation of some new poly morphic thermoelectric compounds", Schweiz. Arch. Angew. Wiss. Techn., 27(No. 11), pp. 458-460, Nov. 1961.

Wernick, "Metallurgy of Some Ternary Semiconductors and Constitution of the AgSbSe$_2$-AgSbTe$_2$-AgBiSe-PbSe-PbTe System", Bell Telephone Laboratories, Inc., Murray Hill, New Jersey, pp. 69-88.

SILVER-CONTAINING THERMOELECTRIC COMPOUNDS

SPONSORSHIP

Work on this invention was sponsored in part by the Office of Naval Research, Grants DAAG 55-97-1-0184 and N00014-01-1-0728. The Government may have certain rights to the invention.

FIELD OF THE INVENTION

The present invention relates generally to thermoelectric materials. In particular, the invention relates to silver-containing semiconductor materials useful in a variety of thermoelectric devices.

BACKGROUND

A variety of thermoelectric devices are known in the art, using thermoelectric materials for the production of electricity or for cooling and heating applications. Thermoelectric devices can have distinct advantages in many applications. For example, an electric power generator based on thermoelectric materials does not use moving parts like conventional power generators. This feature significantly enhances the reliability of the thermoelectric devices by avoiding mechanical wear of the moving parts and corresponding failure. This further reduces the cost of maintenance. Thermoelectric devices also allows operation in hostile environments such as in high temperature conditions (e.g., 900° C.) without human attendance. The unique properties of thermoelectric materials also make the thermoelectric devices environmentally friendly, i.e., industrial heat waste or natural heat sources can be used to generate electric power.

Thermoelectric materials are metals, semi-metals, or semiconducting materials that can convert thermal energy into electrical energy, and visa versa. The basic thermoelectric effects underlying this energy conversion are the Seebeck and Peltier effects. The Seebeck effect is the phenomenon underlying the conversion of heat energy into electrical power and is used in thermoelectric power generation. When a thermoelectric material is subjected to a temperature differential, the Seebeck effect produces an open voltage across the material, which can be used to drive an external load. The complementary effect, the Peltier effect, is the phenomenon used in thermoelectric refrigeration and is related to heat absorption accompanying the passage of current through the junction of two dissimilar materials. When supplied with a voltage, thermoelectric semiconductors respond by virtue of the Peltier effect to produce a temperature differential that can heat or cool an external load.

Although the Seebeck and Peltier effects can be seen with a wide variety of materials, the magnitude of the effect (the Seebeck coefficient, S=dV/dT, where V is voltage and T is temperature) is so low with most materials as to have no practical application. Only certain materials have been found to produce significant thermoelectric effects. Some thermoelectric materials are semiconducting or semi-metallic. These materials conduct electricity by using two types of carriers: electrons and "holes." When one atom in a crystal is replaced by another atom with more valence electrons, the extra electrons from the substituting atom are not needed for bonding and can move around throughout the crystal. Such materials are called "n-type" semiconductors. On the other hand, if an atom in the crystal is replaced with another atom having fewer valence electrons, one or more bonds are left vacant and thus positively charged "holes" are produced, which may be conducting carriers. Such materials are called "p-type" semiconductors.

In its simplest form a thermoelectric module can be constructed around a single semiconductor pellet which is soldered to electrically-conductive material on each end (usually plated copper). Such a module is depicted in FIG. 1a. It is important to note that the heat moves in the direction of charge carrier movement throughout the circuit. In this example, an n-type semiconductor material is used to fabricate the pellet so that electrons (with a negative charge) will be the charge carrier employed to create the thermoelectric effect. P-type semiconductor pellets can also be employed, as shown in FIG. 1b.

While a simple thermoelectric device might be made with a single semiconductor pellet such a device cannot convert an appreciable amount of thermal energy to electricity. In order to provide useful thermoelectric capacity, multiple pellets are used together. Thus, a thermoelectric converter consists of a number of alternate n- and p-type semiconductor elements, which are connected electrically in series by metal interconnects, and sandwiched thermally in parallel between two electrically insulating but thermally conducting ceramic plates, to form a module. If a temperature gradient is maintained across the module, electrical power will be delivered to an external load and the device will operate as a generator. Conversely, when an electric current is passed through the module, heat is absorbed at one face of the module and rejected at the other face, and the device operates as a heat pump.

The efficiency of the thermoelectric materials in such devices is often characterized by a thermoelectric figure of merit, ZT. ZT is a dimensionless parameter and is conventionally defined as:

$$ZT = (S^2 \sigma / \kappa) T;$$

where S is the thermopower or Seebeck coefficient, $\sigma$ the electrical conductivity (S/cm), $\kappa$ the thermal conductivity (W/m-K) and T the temperature (K). The figure of merit represents the coupling between electrical and thermal effects in a material. The larger the ZT, the higher the energy conversion efficiency of a thermoelectric material. An efficient thermoelectric material should have a large Seebeck coefficient, high electrical conductivity, and low thermal conductivity.

Thermoelectric materials such as alloys of PbTe, and $Bi_2Te_3$, BiSb, and others of the formula $Bi_{2-x}Sb_xTe_{3-y}Se_y$, are well known in the art. However, the efficiency of thermoelectric devices made using these materials is relatively low, at approximately five to eight percent energy conversion efficiency. For the temperature range of −100° C. to 1000° C., the maximum ZT of such thermoelectric materials is limited to values of about 1. Furthermore, for the materials such as PbTe and $Bi_2Te_3$, the number of isostructural compounds and the possibility to optimize their properties for maximum performance at different temperatures of operation are limited.

Accordingly, an object of recent research has been to find new materials with enhanced thermoelectric properties. Several classes of materials have been investigated, including complex ternary and quaternary chalcogenides, ternary skutterudites, half-Heusler alloys, ternary metal oxides, intermetallic clathrates, and pentatellurides. Such materials have been described in the following references: Kanatzidis, *Semicond Semimet*, 69, 51-100, (2000); Sales et al., *Science* 272 (5266): 1325-1328, (1996); Poon, *Semicond Semimet* 70, 37-75, (2001); Terasaki et al., *Jpn J Appl Phys* 2 40 (1AB):

L65-L67, (2001); Sales et al., *J Solid State Chem* 146, 528-532 (1999); Nolas et al., *Semicond Semimet* 69, 255-300, (2001); Latturner et al., *Solid State Chem* 151, 61-64 (2000); and Tritt et al., *Semicond Semimet* 70, 179-206, (2001). In another approach, artificial superlattice thin film structures grown from chemical vapor deposition of $Bi_2Te_3/Sb_2Te_3$, and molecular beam epitaxy (MBE) of $PbSe_{0.98}Te_{0.02}/PbTe$ have been described with significantly enhanced ZTs than their bulk counterparts. Such materials are described in the following references: Venkatasubramanian et al., *J Cryst Growth* 170, 817-821, (1997); Harman et al., *J Electron Mater* 25, 1121-1127 (1996); Beyer et al., *Appl Phys Lett* 80, 1216-1218 (2002); Venkatasubramanian et al., *Nature* 413, 597-602, (2001); and Harman et al., *J Electron Mater* 29 (1): L1-L4 (2000). Nevertheless, an even more desirable breakthrough in this area would be the discovery of new reproducible compositions that would generate similar ZT values in a bulk material. This is because the vast majority of applications require bulk materials in large quantities.

Accordingly there remains a need for thermoelectric materials that have a high thermoelectric figure of merit. Use of such materials would produce thermoelectric devices with high efficiencies. Moreover, it would be desirable to have semiconductor materials that are not only good electrical conductors but have a range of band gaps to fit a wide number of applications. It would be further desirable to have materials in which the band gaps could be adjusted to give the desired band gap for the appropriate application. These materials should also be thermally and chemically stable.

SUMMARY

The present invention provides thermoelectric materials of the general formula $Ag_{1-x}M_mM'Q_{2+m}$; wherein M is selected from the group consisting of Pb, Sn, Ca, Sr, Ba, divalent transition metals, and combinations thereof; M' is selected from the group consisting of Bi, Sb, and combinations thereof; Q is selected from the group consisting of Se, Te, S, and combinations thereof; $8 \leq m \leq 24$; and $0.01 \leq x \leq 0.7$. In one embodiment, the materials exhibit n-type semiconductor properties. In a preferred embodiment, x is from about 0.1 to about 0.3, and m is from about 10 to about 18.

In another embodiment, the present invention provides thermoelectric modules comprising an n-type semiconductor of this invention and a p-type semiconductor. The thermoelectric modules may be used to produce a variety of thermoelectric devices that operate according the Peltier or Seebeck effects. In a preferred embodiment, the modules are used for power generation. The invention also includes methods for using the thermoelectric devices.

It has been found that the materials, devices, and methods of the present invention afford advantages over thermoelectric materials among known in the art. Such advantages include increased efficiency, higher thermoelectric figure of merit, greater flexibility for use in a variety of devices, lower cost, stability, and ease of manufacturing. Further areas of applicability and advantages will become apparent from the detailed description provided hereinafter. It should be understood that the detailed description and specific examples, while exemplifying embodiments of the invention, are intended for purposes of illustration only and are not intended to limit the scope of the invention.

Figure 1A:
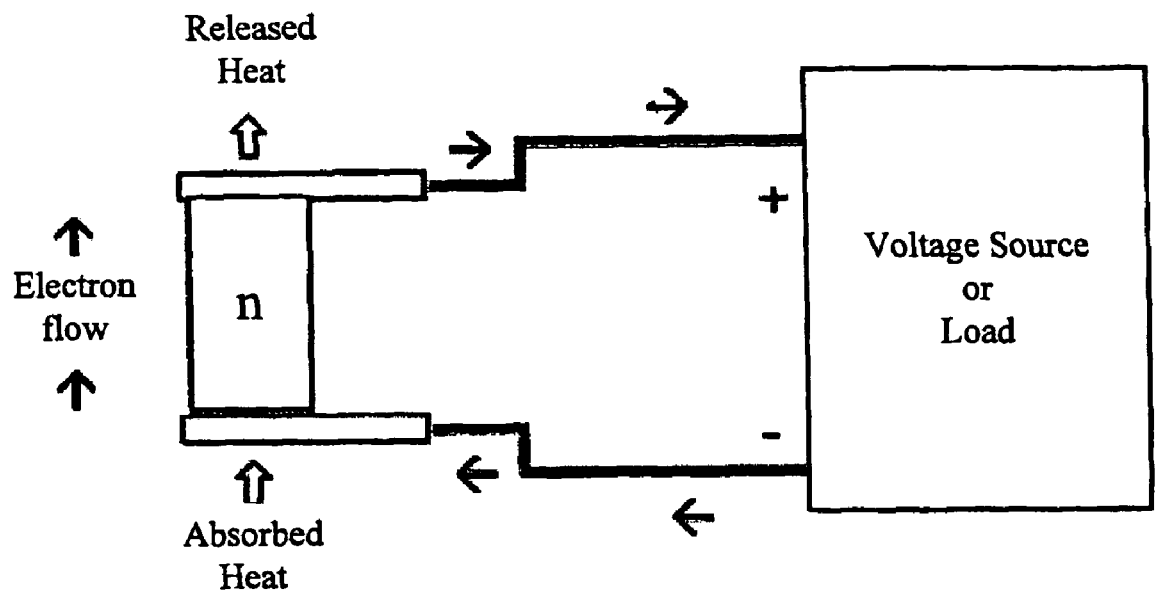
FIGS. 1a and 1b are schematic diagrams of simple thermoelectric circuits.
Figure 1B:
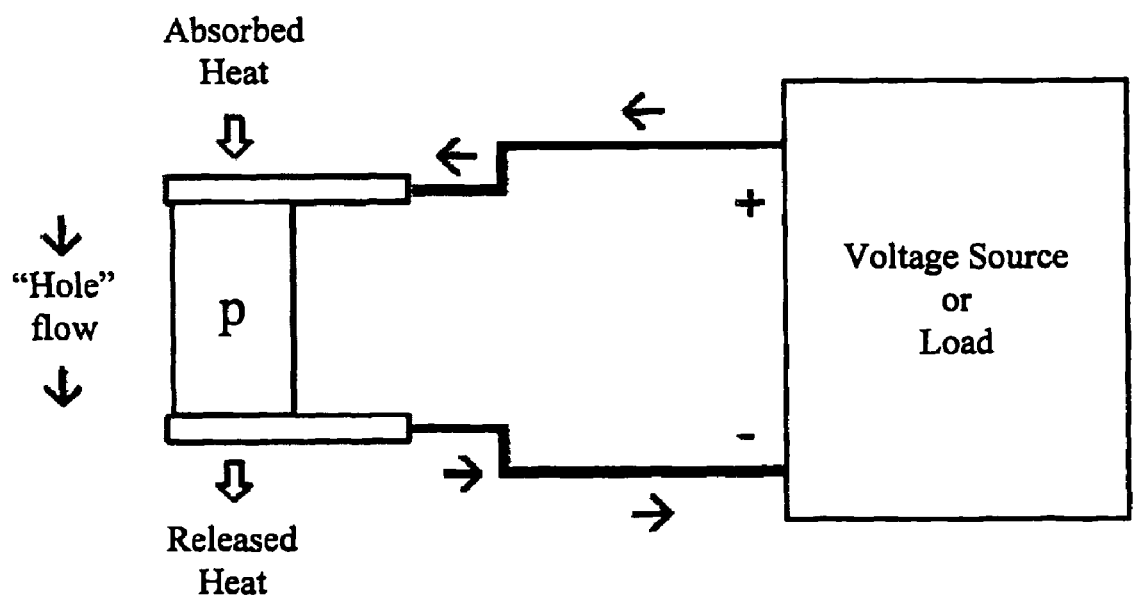

It should be noted that these Figures are intended to show the general characteristics of devices among those of this invention, for the purpose of the description of such embodiments herein. These schematics may not precisely reflect the characteristics of any given embodiment, and are not necessarily intended to define or limit specific embodiments within the scope of this invention.

DETAILED DESCRIPTION

The present invention provides thermoelectric materials comprising silver (Ag). According to one embodiment, the thermoelectric materials have the general formula $Ag_{1-x}M_mM'Q_{2+m}$, wherein:
 (a) M is at least one element selected from the group consisting of Pb (lead), Sn (Tin), Ca (calcium), Sr (strontium), Ba (barium), divalent transition metals, and combinations thereof;
 (b) M' is at least one element selected from the group consisting of Bi (bismuth), Sb (antimony), and combinations thereof;
 (c) Q is at least one element selected from the group consisting of Se (selenium), Te (tellurium), S (sulfur); and combinations thereof, and
 (d) $8 \leq m \leq 24$, and $0.01 \leq x < 1$.

In a preferred embodiment, $0.05 \leq x \leq 0.6$; more preferably $0.1 \leq x \leq 0.3$. Preferably $10 \leq m \leq 24$; more preferably $12 \leq m \leq 22$; more preferably $15 \leq m \leq 20$. (As used herein, the words "preferred" and "preferably" refer to embodiments of the invention that afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.)

Divalent transition metals useful herein include Ti (Titanium), V (Vanadium), Cr (Chromium), Mn (Manganese), Fe (Iron), Co (Cobalt), Ni (Nickel), Cu (Copper), Zn (Zinc), Pd (Palladium), Cd (Cadmium), Pt (Platinum), Hg (Mercury), and mixtures thereof. Preferred are the first row transition series (the 4th Period of the Periodic Table), selected from the group consisting of Ti, V, Cr, Mn, Fe, Co, Ni, Cu, and mixtures thereof. Particularly preferred transition metals useful here include Fe, Co, Mn, Cu, V, Cr, and mixtures thereof. (As used herein, the word "include," and its variants, is intended to be non-limiting, such that recitation of items in a list is not to the exclusion of other like items that may also be useful in the materials, compositions and methods of this invention.)

In a preferred embodiment, M is Pb. Preferably, M' is Sb, Bi, or a combination of Sb and Bi in any ratio such that the total subscript of $Sb_nBi_{1-n}$ adds to unity. In a preferred embodiment, M' is Sb (n=1). Preferably, Q comprises Te. Preferred thermoelectric materials of this invention include those selected from the group consisting of $Ag_{1-x}Pb_{12}M'Q_{14}$; $Ag_{1-x}Pb_{14}M'Q_{16}$; $Ag_{1-x}Pb_{16}M'Q_{18}$; $Ag_{1-x}Pb_{18}M'Q_{20}$; and mixtures thereof. Particularly preferred materials include those selected from the group consisting of $Ag_{0.84}Pb_{18}SbTe_{20}$; $Ag_{0.81}Pb_{18}SbTe_{20}$; $Ag_{0.84}Pb_{18}SbSe_{20}$; $Ag_{0.75}Pb_{18}SbSe_{20}$; $Ag_{0.76}Pb_{18}SbTe_{20}$; and mixtures thereof.

In embodiments of this invention, the thermoelectric materials generally have a cubic crystal lattice structure of the same type as NaCl, wherein the cations (such as Ag, M, and M' metals) occupy the Na sites and the anions (Q) occupy the Cl sites. The cations, although differing in charge, are similar in size and tend to become randomly dispersed throughout the structure. Because x is greater than zero, some of the cation sites in the cubic structure will be vacant in embodiments of this invention. The cubic crystal structure is independent of the values for x and m and depends only on the elements selected to form the thermoelectric materials. A property of certain preferred embodiments is a morphology of low anisotropy. The cubic structure also gives rise to relatively high carrier mobilities and ease of crystal growth and processing. The compounds of the present invention also have relatively high melting point temperatures, and a high degree of structural stability. In embodiments of this invention, the melting temperatures are greater than about 850° C.

In embodiments of this invention, the thermoelectric materials exhibit n-type semiconductor behavior. As written with the nominal formula $Ag_{1-x}M_mM'Q_{m+2}$, they appear not to be electrically balanced, at least when M and M' are nominally assigned valences of +2 and +3, respectively. However, without being bound by theory, in some embodiments it is believed that the nominal lack of electrical balance is compensated by the presence of "extra" electrons in the material, thus making the materials n-type semiconductors.

In embodiments of this invention, the thermoelectric materials exhibit band gaps which are tunable. The term "band gap" refers to the energy difference between the highest occupied electron state and the lowest unoccupied electron state in the material. Further, by "tunable" it is meant that this energy difference can be manipulated to obtain the desired band gap. In one embodiment, the band gap is tuned by varying the values of n and m. In another embodiment, the band gap is tuned by selection of Q. Depending on the application, appropriate band gaps can be chosen.

In another embodiment, the present invention provides combinations of the thermoelectric materials of this invention. Preferably such combinations are solid solutions. The term "solid solution" refers to a single, solid, relatively homogenous crystalline phase containing two or more chemical species. While the n and m values in the component materials provide a coarse dial to control band-gap, the mixtures of compounds in solid solutions afford a fine dial for band gap engineering.

In one embodiment, the materials of the present invention are not externally doped, and are substantially free of dopants. As referred to herein, "substantially free" means that the materials contain no external dopant, or an amount of dopant that does not significantly affect the thermoelectric characteristics of the material. Preferably such a material contains less than about 0.0001% by weight of dopants.

In other embodiments, the materials are doped with selected impurities to produce p-type and n-type conductors having specific desired thermoelectric properties such as enhanced Seebeck coefficients and figures of merit (ZT). In an enhanced n-type conductor, one atom is replaced by another atom having more valence electrons, wherein the extra electrons are not needed for bonding and are free to move throughout the crystal. Isovalent anionic dopants, where S or Se is substituted for Te and S for Se may be used in about less than 1 atomic percent. Other examples of compounds that can be used for doping are the halides $SbX_3$, $BiX_3$, $Hg_2X_2$, and $DX_2$ where X is selected from the group consisting of chlorine, bromine, iodine, and mixtures thereof, and D is selected from the group consisting of chromium, manganese, iron, cobalt, nickel, copper, zinc, magnesium, and mixtures thereof. Alternatively, a p-type conductor is formed when an atom in the isostructural compound is replaced by another atom with fewer electrons, leaving a bond vacant wherein this shortage is referred to as a "hole." For the cationic sites of Bi or Sb (Group V) and Pb or Sn (Group IV), doping with one electron deficient elements such as Group IV elements (Ge, Sn, Pb) and Group III elements (Al, Ga, In, Tl), respectively, may produce more hole carriers which give rise to improved electrical properties. These are examples of compounds that can be used for doping and are in no way meant to be limiting.

Doping of the isostructural compounds of the present invention can be achieved by introducing the desired amount of dopant during synthesis. Stoichiometric amounts of the dopant can be added to the starting materials. Alternately, the compounds of the present invention can be doped by co-melting the desired compound and the dopant and recooling the new mixture. The amount of dopant preferably ranges from about 0.0001% to about 4% by weight.

Synthesis:

The semiconductor materials of the present invention can be synthesized using a variety of starting materials, including the pure elements themselves. According to one embodiment, the group of starting materials includes $Ag_2Q$, M, M' and Q. In another embodiment the group of starting materials are $Ag_2Q$, $M'_2Q_3$, M and Q, wherein M and Q can be in the form of MQ as will be described below. In yet another embodiment, the pure elements, Ag, M, M' and Q, in the correct stoichiometric ratios can be used to synthesize the thermoelectric materials of the present invention.

In the above methods, $Ag_2Q$ can be prepared by reacting amounts of the elemental Ag (2 moles) with the elemental Q (1 mole) for example in liquid ammonia. When the reaction is complete, the ammonia is conveniently removed by evaporation at ambient temperature. The resulting product may be dried and ground to give a fine homogeneous powder.

$M'_2Q_3$ can generally be prepared by reacting amounts of elemental Bi or Sb (2 moles) and elemental Q (3 moles) at 800° C. for about 1-3 days at ambient pressure or optionally under a vacuum to reduce reaction times. Alternatively, bismuth telluride can be obtained commercially, for example, from Johnson Matthey/AESAR Group, Seabrook, N.H., U.S.A., and bismuth selenide can be obtained commercially, for example, from Cerac, Inc, Milwaukee, Wis., U.S.A.

MQ can be synthesized, for example, by thoroughly mixing stoichiometric amounts (1 mole each) of Q with elemental Pb and optionally other divalent transition metal, followed by loading the mixture into a silica tube, preferably at a low residual pressure such as $10^{-4}$ Torr or less. The mixture is then heated for example to 800° C. over a 24 hour period and the temperature maintained for an additional 24 hours. The mixture may then be cooled by quenching in water and the resulting ingot crushed to a fine powder. The powder is then reloaded into a quartz tube and heated to 800° C. over a 24 hour period. The temperature of the mixture is maintained at 800° C. for an additional 24 hours and then slowly cooled to 300° C. at a rate of about 4° C./hr and subsequently to 50° C. over about 6 hours. The resulting ingots are ground to a fine powder prior to synthesis of the compounds of the present invention.

Upon forming each of the compounds included in the groups of starting materials, the isostructural compounds of the present invention may be synthesized as follows. The chosen starting materials are thoroughly mixed and loaded into a carbon coated silica or capped graphite tube at a residual pressure less than $10^{-4}$ Torr, i.e., either the group of $Ag_2Q$, M metal, M' metal and elemental Q or the group $Ag_2Q$, $M'_2Q_3$ and MQ. The mixture is heated to 700° C. at a rate of about 30° C./hr. After maintaining the temperature at 700° C.

for approximately 3 days, the mixture is cooled to 300° C. at a rate of 5° C./hr followed by cooling to 50° C. in about 12 hours. The resulting product is washed with degassed dimethylformamide and water in a nitrogen atmosphere. After further washing with diethyl ether and subsequent drying, the isostructural compounds of the present invention are obtained as shiny silvery-black chunks exhibiting a cubic crystal structure.

The thermoelectric materials of the present invention can also be synthesized from pure elements. The appropriate elements for the desired compound, Ag, M, M' and Q, are mixed together in the correct stoichiometric ratios (i.e., 1−x for Ag, m for Pb and optional other divalent elements, 1 for Bi/Sb, and m+2 for Q) and sealed in a quartz tube under vacuum, i.e., <$10^{-3}$ Torr. The mixture is then heated in a direct flame until molten. Subsequent cooling of the melt yields the corresponding compound.

In one aspect, thermoelectric materials are prepared by a process comprising the steps of adding appropriate stoichiometric amounts of starting materials containing Ag, M, M', and Q to a reaction vessel, heating the starting materials to a temperature and for a period of time, during which the starting materials melt and react to form the compounds. Then the materials are cooled at a controlled rate.

The thermoelectric figure of merit, ZT, of the resulting conductive material may be subtly affected by synthesis parameters such as the temperature and time of heating, as well as the rate of cooling. In many cases it is desired to produce a material having a specific ZT. In other cases it is desired to find a set of parameters that will give an optimum ZT. In still other cases it will be desired to produce materials with an acceptable ZT, but optimized with respect to process time, process cost, or another property.

Thus, the present invention also provides methods of formulating thermoelectric materials of a specific composition having the formula $Ag_{1-x}M_mM'Q_{2+m}$, wherein (a) M is at least one element selected from the group consisting of Pb, Sn, Ca, Sr, Ba, divalent transition metals, and combinations thereof;

(b) M' is at least one element selected from the group consisting of Bi, Sb, and combinations thereof;

(c) Q is at least one element selected from the group consisting of Se, Te, S, and combinations thereof; and (d) $8 \leq m \leq 24$, and $0.01 \leq x \leq 1$.

and wherein said material is made by a process comprising the steps of (e) adding stoichiometric amounts of starting materials comprising Ag, M, M', and Q to a reaction vessel;

(f) heating the starting materials to a temperature and for a period of time sufficient to melt all of said materials;

(g) cooling said materials at a controlled rate of cooling.

said method comprising:

(1) making a plurality of samples of said material having said composition, using said process, wherein said temperature, said period of time; and said rate of cooling are varied among the processes used to make said samples;

(2) comparing the ZT of said samples; and (3) selecting a temperature, period of time and rate of cooling that yields a material having a desired ZT.

In such methods, parameters may be found that yield materials having a desired ZT by making a plurality of samples of the material having a certain composition. Then a set of syntheses may be carried out by the above process, wherein the parameters are varied and the resulting ZT of the samples is compared. In a preferred embodiment, the parameters to be varied are selected using statistical experimental design.

Uses of the Materials:

The thermoelectric materials of the present invention may be used in a variety of thermoelectric devices. Such devices include electrical power generators, heater, coolers, thermocouples, temperature sensors and radioisotope thermoelectric generators. Such devices may be used in a wide variety of applications, including waste heat recovery systems, automobiles, remote power generators, and coolers for advanced electronic components such as field effect transistors.

In particular, the thermoelectric materials of the present invention can be used in optical applications including infrared and near infrared detectors, lasers and photovoltaic cells such as solar cells. In optical applications, at least two materials having different band gaps are layered together to give the desired optical properties. The thermoelectric materials of the present invention have a wide range of band gaps that can be finely tuned to give optimal performance in such optical applications. The isostructural compounds of the present invention can also be used in multi-spectral sensors. Multi-spectral sensors (e.g. long wavelength and short wavelength) offer the possibility of improved clutter rejection and improved recognition range.

In preferred embodiments, the thermoelectric compounds of this invention are used in thermoelectric devices. Such devices may be used for heating, cooling, temperature stabilization, power generation and temperature sensing. Such thermoelectric devices are essentially heat pumps and power generators which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components.

An efficient thermoelectric device is fabricated from two materials: an n-type conductor and a p-type conductor. Each material is separately chosen to optimize the figure of merit, ZT. These thermoelectric devices preferably contain thermoelectric elements made of a circuit of the n-type semiconductor and the p-type semiconductor joined electrically in series, to form a thermocouple. The couple of n- and p-type semiconductors may be a p-n junction in a semiconductor crystal, or it may take the form of a conductor physically affixed to the ends of the semiconductors. The n-type material and the p-type material are preferably chosen to have compatible properties, so the physical properties of one semiconductor material does not limit the physical properties of the other semiconductor material when they are formed into a semiconductor couple.

A plurality of thermocouples may be joined together electrically in series, and thermally in parallel, to form a thermoelectric module (or thermopile), that serves as a solid state heat pump or thermoelectric generator. Generally, the p-type and n-type semiconductors, in the form of, for example, wafers or pellets, may be formed into an array by being sandwiched between, for example, metallized substrates. By connecting a thermoelectric module to a direct circuit (DC) power source in a heating or cooling device, heat will be absorbed at one end of the device, thereby cooling it while heat is rejected at the device's other end. In a power generation device, current is generated in the external circuit by creating a thermal gradient across the device.

Several methods for constructing thermoelectric devices have been developed. Such methods include without limitation, mechanical clamping, epoxy bonding, plating, sputtering, and direct solder bonding. The individual requirements of the application will in general determine which method is most appropriate. In a preferred embodiment, mechanical clamping is used. Whichever method of installation is used, it is important to avoid excessive mechanical loading of the module.

Thermal resistance occurs at each interface of an assembly and affects overall system performance. In mechanically clamped systems, the flatness of interface surfaces is preferably within 0.03 mm. In preferred embodiments, even with this degree of flatness, interface materials may be used to fill in small thermal gaps. Typical choices for such interface materials include silicone-based thermal grease, graphite foil, and thermally conductive pads. Special care should be taken to ensure that uniform pressure is applied during installation. Preferably, the mounting and module surfaces should be cleaned to remove grit, burrs, and the like.

Figure 2:
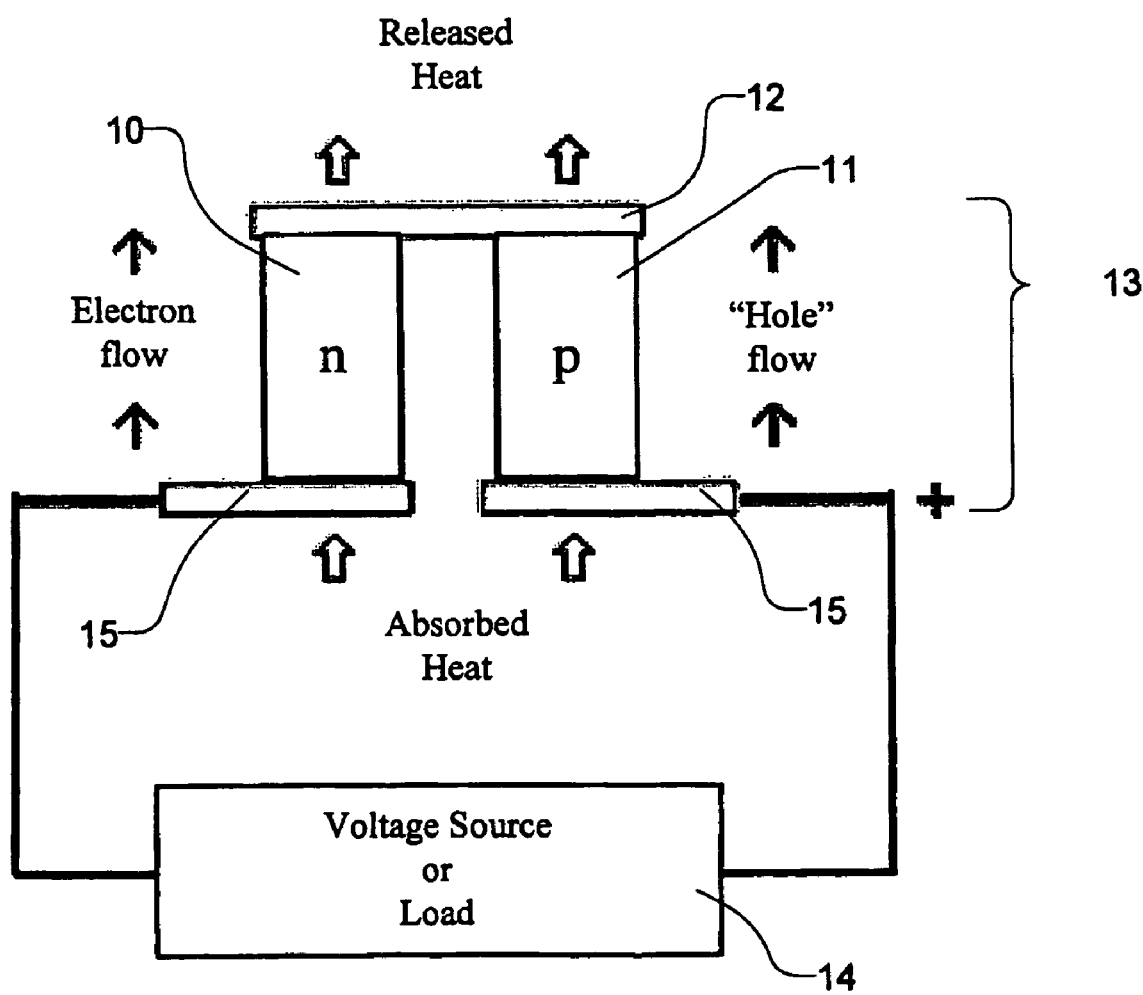
FIG. 2 is a schematic diagram of a thermoelectric couple.

A simple thermocouple is schematically illustrated in FIG. 2. An n-type semiconductor (10) of this invention and a p-type semiconductor (11) are connected at one end to a conductor (12) to form a couple (13). The semiconductors (15) are connected at the other end to an external circuit, here illustrated by second conductors (15) attached to lead wires connecting the couple to the external circuit (14).

The external circuit (14) may take on a number of forms, depending on the use for which the thermoelectric device containing the thermoelectric elements of the invention is intended. For example, the external circuit may include a source of DC power, in which case the thermoelectric device operates as a heat pump according to the Peltier effect. In another embodiment, the external circuit (14) may contain an electric load, in which case the thermoelectric device operates as a thermoelectric generator according to the Seebeck effect.

Figure 3A:
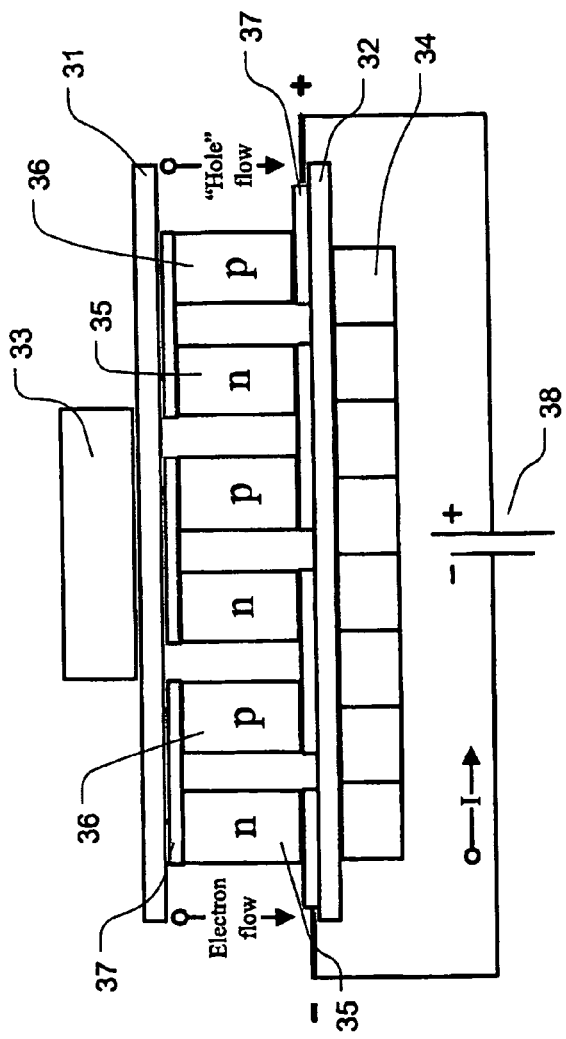
FIGS. 3a and 3b are schematic diagrams of thermoelectric heat pump and power generation devices.

A non-limiting embodiment of a heat pump incorporating a thermoelectric device of the present invention is illustrated in FIG. 3a. The heat pump (30) comprises an upper ceramic substrate (31) and a lower ceramic substrate (32). The outer surface of the upper ceramic substrate (31) (i.e., the surface opposite from the surface in contact with the semiconductor array) is placed in contact with the surface of an object to be cooled (33) and the outer surface of the lower ceramic substrate (32) is contacted with a heat sink (34) to dissipate absorbed heat. N-type semiconductors of this invention (35) and p-type semiconductors (36) are provided between the upper ceramic substrate (31) and the lower ceramic substrate (32). Electrically conductive layers (37) are provided on the inside of the ceramic substrate (31 and 32), electrically joining adjacent n-type semiconductor and p-type semiconductors, so the semiconductors are electrically in series. A direct current source (38) is connected to the conductors (37) so that current flow is in the direction of the flow of heat through the device.

In operation, heat is absorbed at the first ceramic substrate (31) and rejected at the second ceramic substrate (32) through the heat sink (34) by the Peltier Effect when conductors (37) are connected to the DC source (38) in the manner illustrated in FIG. 3a. The direction of heat flow in the heat pump (30) may be reversed by reversing the current flow to the conductive layers—upon such reversal the thermoelectric device can heat the object (33) in thermal contact with the first substrate (31) by the Peltier effect. This application of heating pumping may be applied in a variety of applications, including small laser diode coolers, cooling of solid state electrical components, portable refrigerators, scientific thermal conditioning, liquid coolers, and the like.

Thermoelectric systems may be designed having a variety of capacities for pumping heat, for example in watts or BTU (British Thermal Units) per hour. The capacity for pumping heat will be influenced by a number of factors, including ambient temperature, physical and electrical characteristics of the thermoelectric modules employed, and efficiency of the heat dissipation system or sink. Typical thermoelectric applications will pump heat loads ranging from several milliwatts to hundreds of watts.

In a preferred embodiment, the present invention provides thermoelectric power generators, that function as thermoelectric generators by the Seebeck effect. When a source of heat is provided to a thermoelectric element containing a couple of p-type and n-type semiconductor material, current is generated in an external circuit. The net affect of the device is to convert heat energy into electric energy. The heat may come from a number of sources, including kerosene lamps, firewood, automobile exhaust heat, stationary combustion engine exhaust heat, and radioactive sources such as $^{90}$Sr.

Figure 3B:
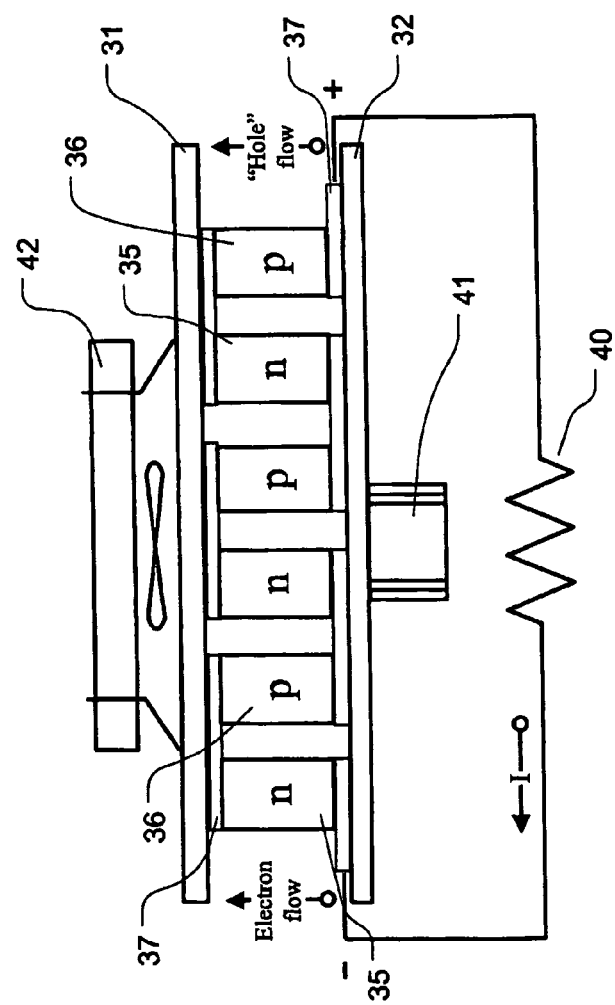

Thermoelectric generators of the invention are schematically exemplified in FIG. 3b. This system is similar to that of the cooling/heating system of FIG. 3a, except that the voltage supply is replaced with an electrical load. N-type semiconductors (35) of this inventions and p-type semiconductors (36) are electrically joined in series with conductors (37). The electrodes are connected with leads to a load (40). The semiconductors are arranged thermally in parallel, sandwiched between an upper ceramic substrate (31) at the cold junction, and a lower ceramic substrate (32) at the hot junction. The thermoelectric generator generates a current when the hot junction is heated with a heater (41) to temperature $t_H$. The cold junction is cooled to a temperature $t_C$ lower than $t_H$ using a cooling fan (42). A voltage difference exists across the device as a result of the Seebeck effect. If a load resistance (40) is provided in the circuit, the voltage difference between the electrodes will produce an electric current. In this way, the thermoelectric generator illustrated in FIG. 3b turns heat energy into electric energy in the load resistance.

The following are non-limiting examples of the invention.

EXAMPLES

A thermoelectric material of the present invention, having the nominal formula $Ag_{1-x}Pb_{18}SbTe_{20}$, where x=0.24, is made by loading appropriate stoichiometric amounts of Ag, Pb, Sb, and Te into a reaction vessel and heating. In particular, 0.128 grams Ag, 5.823 grams Pb, 0.1901 grams Sb, and 3.9846 grams Te are placed into a 13 mm silica tube and sealed under vacuum (about 10−4 torr). The tube is arranged in a rocking furnace. The furnace is heated up to 980° C. over 1800 hours. The furnace is rocked at 980° C. for 4 hours. Then the rocking is stopped and the furnace is cooled to 550° C. at a rate of 10° C. per hour. Thereafter the furnace is cooled to 50° C. at a rate of 25° C. per hour. The produce is a shiny ingot with a NaCl structure as identified by power X-rayed fraction.

In a similar matter, thermoelectric materials having x=0.16 and 0.19 are also made, with substantially similar results. Also, in a similar manner, thermoelectric materials having the nominal formula $Ag_{1-x}Pb_{18}SbSe_{20}$, wherein x=m 0.24 are made, with substantially similar results.

The examples and other embodiments described herein are exemplary and not intended to be limiting in describing the full scope of materials, devices, and methods of this invention. Equivalent changes, modifications and variations of specific embodiments, materials, compositions and methods may be made with substantially similar results.

We claim:

1. A semiconductor material having the general formula $Ag_{1-x}M_mM'Q_{2+m}$, wherein:
   (a) M is at least one element selected from the group consisting of Pb, Sn, Ca, Sr, Ba, divalent transition metals, and combinations thereof;
   (b) M' is at least one element selected from the group consisting of Bi, Sb, and combinations thereof;
   (c) Q is at least one element selected from the group consisting of Se, Te, S, and combinations thereof; and
   (d) $8 \leq m \leq 24$, and $0.01 \leq x < 1$.

2. A semiconductor material according to claim 1, wherein $0.05 \leq x \leq 0.6$.

3. A semiconductor material according to claim 2, wherein $0.1 \leq x \leq 0.3$.

4. A semiconductor material according to claim 2, wherein $m \geq 10$.

5. A semiconductor material according to claim 2, wherein M is Pb.

6. A semiconductor material according to claim 2, wherein M' is Sb.

7. A semiconductor material according to claim 2, wherein Q is Te.

8. A semiconductor material according to claim 2, of the formula $Ag_{1-x}Pb_{10}M'Q_{12}$.

9. A semiconductor material according to claim 2, of the formula $Ag_{1-x}Pb_{12}M'Q_{14}$.

10. A semiconductor material according to claim 2, of the formula $Ag_{1-x}Pb_{14}M'Q_{16}$.

11. A semiconductor material according to claim 2, of the formula $Ag_{1-x}Pb_{16}M'Q_{18}$.

12. A semiconductor material according to claim 2, of the formula $Ag_{1-x}Pb_{18}M'Q_{20}$.

13. A thermoelectric material according to claim 2 which is substantially free of external dopants.

14. A process of manufacturing a conductive material of the formula $Ag_{1-x}M_mM'Q_{2+m}$, wherein
   (a) M is at least one element selected from the group consisting of Pb, Sn, Ca, Sr, Ba, divalent transition metals, and combinations thereof;
   (b) M' is at least one element selected from the group consisting of Bi, Sb, and combinations thereof;
   (c) Q is at least one element selected from the group consisting of Se, Te, S, and combinations thereof; and
   (d) $8 \leq m \leq 24$, and $0.05 \leq x \leq 0.6$;
said process comprising:
   (1) adding stoichiometric amounts of starting materials comprising Ag, M, M', and Q to a reaction vessel;
   (2) heating said starting materials to a temperature and for a period of time sufficient to melt all of said materials;
   (3) cooling said materials at a controlled rate of cooling.

15. A process according to claim 14, wherein the starting materials comprise elemental starting materials.

16. A process according to claim 15 wherein $0.1 \leq x \leq 0.3$, and $m \geq 10$.

17. A process according to claim 16, wherein M is Pb, M' is Sb, and Q is Te.

18. A method of formulating a thermoelectric material of a specific composition having the formula $Ag_{1-x}M_mM'Q_{2+m}$, wherein
   (a) M is at least one element selected from the group consisting of Pb, Sn, Ca, Sr, Ba, divalent transition metals, and combinations thereof;
   (b) M' is at least one element selected from the group consisting of Bi, Sb, and combinations thereof;
   (c) Q is at least one element selected from the group consisting of Se, Te, S, and combinations thereof; and
   (d) $8 \leq m \leq 24$, and $0.05 \leq x \leq 0.6$;
and wherein said material is made by a process comprising the steps of
   (e) adding stoichiometric amounts of starting materials comprising Ag, M, M', and Q to a reaction vessel;
   (f) heating the starting materials to a temperature and for a period of time sufficient to melt all of said materials;
   (g) cooling said materials at a controlled rate of cooling;
said method comprising:
   (1) making a plurality of samples of said material having said composition, using said process, wherein said temperature, said period of time; and said rate of cooling are varied among the processes used to make said samples;
   (2) comparing the ZT of said samples; and
   (3) selecting a temperature, period of time and rate of cooling that yields a material having a desired ZT.

19. A process according to claim 18 wherein $0.1 \leq x \leq 0.3$, and $m \geq 10$.

20. A process according to claim 19, wherein M is Pb, M' is Sb, and Q is Te.

21. An n-type semiconductor material of the formula $Ag_{1-x}M_mM'Q_{2+m}$ wherein
   (a) M is at least one element selected from the group consisting of Pb, Sn, Ca, Sr, Ba, divalent transition metals, and combinations thereof;
   (b) M' is at least one element selected from the group consisting of Bi, Sb, and combinations thereof;
   (c) Q is at least one element selected from the group consisting of Se, Te, S, and combinations thereof; and
   (d) $8 \leq m \leq 24$, and $0.01 \leq x < 1$.

22. An n-type semiconductor material according to claim 21, wherein $0.05 \leq x \leq 0.6$.

23. An n-type semiconductor material according to claim 22, wherein M is Pb.

24. An n-type semiconductor material according to claim 22, wherein $0.1 \leq x \leq 0.3$.

25. An n-type semiconductor material according to claim 22, wherein m is $\geq 10$.

26. An n-type semiconductor material according to claim 22, which is substantially free of external dopants.

27. A thermoelectric element comprising an n-type semiconductor and a p-type semiconductor joined electrically at one end to form a couple, wherein the n-type semiconductor comprises a composition having the general formula $Ag_{1-x}M_mM'Q_{2+m}$, wherein:
   (a) M is at least one element selected from the group consisting of Pb, Sn, Ca, Sr, Ba, divalent transition metals, and combinations thereof;
   (b) M' is at least one element selected from the group consisting of Bi, Sb, and combinations thereof;
   (c) Q is at least one element selected from the group consisting of Se, Te, S, and combinations thereof; and
   (d) $8 \leq m \leq 24$, and $0.05 \leq x \leq 0.6$.

28. A thermoelectric element according to claim 27, wherein $0.1 \leq x \leq 0.3$.

29. A thermoelectric element according to claim 27, wherein M is Pb.

30. A thermoelectric element according to claim 27, wherein Q comprises Te.

31. A thermoelectric element according to claim 27, wherein M' is Sb.

32. A thermoelectric element according to claim 28, wherein $m \geq 10$.

33. A thermoelectric generator comprising a thermoelectric element according to claim 27.

34. A method for generating electric current from heat energy, comprising applying heat energy to a thermoelectric module operating according to the Seebeck effect, wherein the thermoelectric module comprises a semiconductor material comprising a composition having the general formula $Ag_{1-x}M_mM'Q_{2+m}$, wherein:
- (a) M is at least one element selected from the group consisting of Pb, Sn, Ca, Sr, Ba, divalent transition metals, and combinations thereof;
- (b) M' is at least one element selected from the group consisting of Bi, Sb, and combinations thereof;
- (c) Q is at least one element selected from the group consisting of Se, Te, S, and combinations thereof; and
- (d) $8 \leq m \leq 24$, and $0.01 \leq x < 1$.

35. A method according to claim 34, wherein $0.05 \leq x \leq 0.6$.

36. A method according to claim 35, wherein $0.1 \leq x \leq 0.3$.

37. A method according to claim 35, wherein $m \geq 10$.

38. A method according to claim 35, wherein M is Pb.

39. A method according to claim 38, wherein M' is Sb.

40. A method according to claim 38, wherein Q comprises Te.

41. A method according to claim 38, wherein the composition comprises
$Ag_{1-x}Pb_{10}M'Q_{12}$.

42. A method according to claim 38, wherein the composition comprises
$Ag_{1-x}Pb_{12}M'Q_{14}$.

43. A method according to claim 38, wherein the composition comprises
$Ag_{1-x}Pb_{14}M'Q_{16}$.

44. A method according to claim 38, wherein the composition comprises
$Ag_{1-x}Pb_{16}M'Q_{18}$.

45. A method according to claim 38, wherein, the composition comprises
$Ag_{1-x}Pb_{18}M'Q_{20}$.

46. A method according to claim 35, wherein the heat energy is generated by radioactive isotope decay.

47. A method according to claim 35, wherein the heat energy is generated by capturing solar energy.

48. A method according to claim 35, wherein the heat energy is generated by burning fossil fuels.

* * * * *

UNITED STATES PATENT AND TRADEMARK OFFICE
CERTIFICATE OF CORRECTION

| | | |
|---|---|---|
| PATENT NO. | : 7,592,535 B2 | Page 1 of 1 |
| APPLICATION NO. | : 10/571338 | |
| DATED | : September 22, 2009 | |
| INVENTOR(S) | : Mercouri Kanatzidis et al. | |

It is certified that error appears in the above-identified patent and that said Letters Patent is hereby corrected as shown below:

TITLE PAGE, No. (73) Assignee, "Board of Trustees operating Michingan State University" should be --Board of Trustees operating Michigan State University--.

Column 3, line 47, after "according", insert --to--.

Column 3, line 53, after "among", insert --those--.

Column 8, line 6, "heater" should be --heaters--.

Column 9, line 57, "Effect" should be --effect--.

Column 9, line 63, "heating" should be --heat--.

Column 10, line 14, "material" should be --materials--.

Column 10, line 24, "inventions" should be --invention--.

Column 10, line 49, "torr" should be --Torr--.

Column 11, line 57, Claim 16, "$m \leq 10$" should be --$m \geq 10$--.

Column 12, line 20, Claim 19, "$m \leq 10$" should be --$m \geq 10$--.

Signed and Sealed this

Fourth Day of May, 2010

David J. Kappos
*Director of the United States Patent and Trademark Office*